United States Patent
Park et al.

(10) Patent No.: US 10,003,011 B2
(45) Date of Patent: Jun. 19, 2018

(54) MAGNETIC MEMORY DEVICES AND METHODS FOR MANUFACTURING THE SAME

(71) Applicants: Sang Hwan Park, Hwaseong-si (KR); Keewon Kim, Suwon-si (KR); Youngman Jang, Hwaseong-si (KR); Kwangseok Kim, Seoul (KR)

(72) Inventors: Sang Hwan Park, Hwaseong-si (KR); Keewon Kim, Suwon-si (KR); Youngman Jang, Hwaseong-si (KR); Kwangseok Kim, Seoul (KR)

(73) Assignee: Samsung Electronics, Co., Ltd., Gyeonggi-Do (KE)

( * ) Notice: Subject to any disclaimer, the term of this patent is extended or adjusted under 35 U.S.C. 154(b) by 0 days. days.

(21) Appl. No.: 15/454,210

(22) Filed: Mar. 9, 2017

(65) Prior Publication Data

US 2017/0294571 A1    Oct. 12, 2017

(30) Foreign Application Priority Data

Aug. 4, 2016 (KR) .................. 10-2016-0099596

(51) Int. Cl.
*H01L 43/02* (2006.01)
*H01L 43/08* (2006.01)
(Continued)

(52) U.S. Cl.
CPC ............ *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 29/82; G11C 11/16; G11C 11/161; G11C 11/14; G11C 11/15; G11C 11/155
See application file for complete search history.

(56) References Cited

U.S. PATENT DOCUMENTS

| 5,695,864 A | 12/1997 | Slonczewski |
| 6,974,708 B2 | 12/2005 | Horng et al. |

(Continued)

FOREIGN PATENT DOCUMENTS

| KR | 10-0448989 B1 | 9/2004 |
| KR | 10-2012-0094394 A | 8/2012 |

(Continued)

OTHER PUBLICATIONS

E.B. Myers, et al., "Current-Induced Switching of Domains in Magnetic Multilayer Devices", Science 285, 867 (1999).

(Continued)

*Primary Examiner* — Scott B Geyer
(74) *Attorney, Agent, or Firm* — Harness, Dickey & Pierce, P.L.C.

(57) ABSTRACT

A magnetic memory device may include a free magnetic pattern and a capping pattern on a surface of the free magnetic pattern. The capping pattern may include first and second metal elements. The capping pattern may include a first portion adjacent to an interface between the free magnetic pattern and the capping pattern, and a second portion spaced apart from the interface. The first metal element may have a concentration greater in the first portion than in the second portion. The first metal element may have an atomic weight smaller than that of the second metal element. The concentration of the first metal element along the thickness direction of the capping pattern may be proportional to a proximity to the interface.

20 Claims, 11 Drawing Sheets

(51) Int. Cl.
*H01L 43/10* (2006.01)
*H01L 43/12* (2006.01)

(56) References Cited

U.S. PATENT DOCUMENTS

| | | |
|---|---|---|
| 7,110,287 B2 | 9/2006 | Huai et al. |
| 8,120,126 B2 * | 2/2012 | Lee ................. B82Y 25/00 257/414 |
| 8,318,510 B2 | 11/2012 | Choi |
| 8,580,583 B2 | 11/2013 | Lee et al. |
| 8,673,654 B2 | 3/2014 | Hong et al. |
| 8,871,530 B1 | 10/2014 | Hu |
| 8,912,013 B2 | 12/2014 | Zhu et al. |
| 8,981,502 B2 | 3/2015 | Chen et al. |
| 9,147,833 B2 | 9/2015 | Pi et al. |
| 9,172,032 B2 | 10/2015 | Shen et al. |
| 9,236,558 B1 | 1/2016 | Pi et al. |
| 9,257,638 B2 | 2/2016 | Tan et al. |
| 2008/0023740 A1 * | 1/2008 | Horng ................. B82Y 25/00 257/295 |
| 2008/0080102 A1 | 4/2008 | Ibusuki et al. |
| 2011/0116305 A1 * | 5/2011 | Nagamine ............ H01L 43/08 365/158 |
| 2015/0255711 A1 | 9/2015 | Doyle et al. |
| 2016/0133307 A1 | 5/2016 | Lee et al. |
| 2016/0133829 A1 | 5/2016 | Kuo et al. |

FOREIGN PATENT DOCUMENTS

| | | |
|---|---|---|
| KR | 10-1537715 B1 | 7/2015 |
| KR | 10-2016-0056377 A | 5/2016 |

OTHER PUBLICATIONS

J.C. Sionczewski, "Excitation of spin waves by an electric current", Journal of Magnetism and Magnetic Materials 195, (1999) L261-L268.

* cited by examiner

MAGNETIC MEMORY DEVICES AND METHODS FOR MANUFACTURING THE SAME

CROSS-REFERENCE TO RELATED APPLICATIONS

This U.S. nonprovisional patent application claims priority under 35 U.S.C § 119 to Korean Patent Application 10-2016-0099596 filed on Aug. 4, 2016, the entire contents of which are hereby incorporated by reference.

BACKGROUND

The present inventive concepts relate to a semiconductor device and a method for manufacturing the same and, more particularly, to a magnetic memory device and a method for manufacturing the same.

Semiconductor devices are widely used in an electronic industry due to theirs compact size, multifunction, and/or low manufacturing cost. Semiconductor memory devices among the semiconductor devices may store logic data. Since magnetic memory devices among the semiconductor memory devices may operate at high speed and have non-volatile characteristics, they have attracted considerable attention as the next generation semiconductor memory devices.

The magnetic memory device may generally include a magnetic tunnel junction (MTJ) pattern. The magnetic tunnel junction pattern may include two magnetic structures and an insulation layer interposed therebetween. The resistance of the magnetic tunnel junction pattern may vary depending on magnetization directions of the two magnetic structures. For example, the magnetic tunnel junction pattern may have high resistance when the magnetization directions of the two magnetic structures are anti-parallel and low resistance when the magnetization directions of the two magnetic structures are parallel. The magnetic memory device may write/read data using the resistance difference between the high and low resistances of the magnetic tunnel junction pattern.

SUMMARY

Example embodiments of the present inventive concepts provide a magnetic memory device having superior reliability.

Example embodiments of the present inventive concepts provide a method for manufacturing a magnetic memory device capable of enhancing reliability.

According to some example embodiments of the present inventive concepts, a magnetic memory device, may include: a pinned magnetic pattern; a free magnetic pattern; a tunnel barrier pattern between the pinned magnetic pattern and the free magnetic pattern, wherein the free magnetic pattern includes a first surface in contact with the tunnel barrier pattern and a second surface opposite the first surface; and a capping pattern on the second surface of the free magnetic pattern. The capping pattern may include a first portion adjacent to an interface between the free magnetic pattern and the capping pattern, a second portion spaced apart from the interface, and a first metal element and a second metal element, the second metal element having an atomic weight greater than an atomic weight of the first metal element, the first portion including a concentration of the first metal element that is greater than a concentration of the first metal element in the second portion.

According to some example embodiments of the present inventive concepts, a method of manufacturing a magnetic memory device may include: sequentially forming a pinned magnetic layer, a tunnel barrier layer, and a free magnetic layer on a substrate; and forming a first metal layer and a second metal layer on the free magnetic layer. The first metal layer may include a first metal element, the second metal layer may include a second metal element, the second metal layer being formed based on depositing the second metal element on the first metal layer, the second metal element having an atomic weight greater than an atomic weight of the first metal element.

According to some example embodiments of the present inventive concepts, a magnetic memory device may include: a free magnetic pattern; and a capping pattern on the free magnetic pattern. The capping pattern may include a first metal element and a second metal element, the second metal element having an atomic weight greater than an atomic weight of the first metal element, the capping pattern including a concentration of the first metal element that varies along a thickness direction of the capping pattern, such that the concentration of the first metal element is proportional with a proximity to an interface between the capping pattern and the free magnetic pattern.

According to some example embodiments of the present inventive concepts, a magnetic memory device may include: a free magnetic pattern; and a non-oxidized capping pattern on the free magnetic pattern. The capping pattern may include a first portion proximate to an interface between the free magnetic pattern and the capping pattern, the first portion including a first concentration of a first metal element and a first concentration of a second metal element, and a second portion distal from the interface, the second portion including a second concentration of the first metal element and a second concentration of the second metal element, the second concentration of the first metal element smaller than the first concentration of the first metal element, the second concentration of the second metal element greater than the first concentration of the second metal element.

DETAILED DESCRIPTION OF EMBODIMENTS

Figure 1:
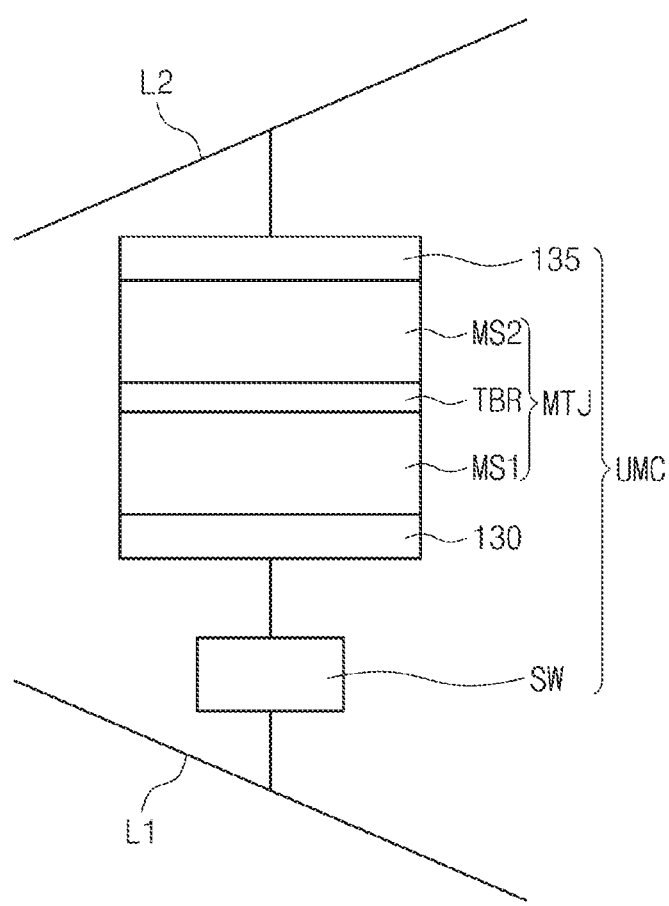
FIG. 1 is a circuit diagram showing a unit memory cell of a magnetic memory device according to some example embodiments of the present inventive concepts.

FIG. 1 is a circuit diagram showing a unit memory cell of a magnetic memory device according to some example embodiments of the present inventive concepts.

Referring to FIG. 1, a unit memory cell UMC may be disposed between first and second interconnect lines L1 and L2, which cross each other and are connected to each other by the unit memory cell UMC. The unit memory cell UMC may include a select element SW and a magnetic tunnel junction MTJ. The select element SW and the magnetic tunnel junction MTJ may be electrically connected in series to each other. One of the first and second interconnect lines L1 and L2 may be used as a word line, and the other may be used as a bit line.

The select element SW may be configured to selectively control a charge flow passing through the magnetic tunnel junction MTJ. For example, the select element SE may be at least one of a diode, a PNP bipolar transistor, an NPN bipolar transistor, an NMOS field effect transistor, and a PMOS field effect transistor. If and/or when the select element SW is composed of a three-terminal device such as a bipolar transistor or a MOS field effect transistor, an additional interconnect line (not shown) may be connected to the select element SW.

The magnetic tunnel junction MTJ may include a first magnetic structure MS1, a second magnetic structure MS2, and a tunnel barrier pattern TBR therebetween. Each of the first and second magnetic structures MS1 and MS2 may include at least one magnetic layer formed of (e.g., at least partially comprising) a magnetic material. In some example embodiments, as shown in FIG. 1, the unit memory cell UMC may further include a first conductive structure 130, which is interposed between the first magnetic structure MS1 and the select element SW, and a second conductive structure 135, which is interposed between the second magnetic structure MS2 and the second interconnect line L2.

Figure 2:
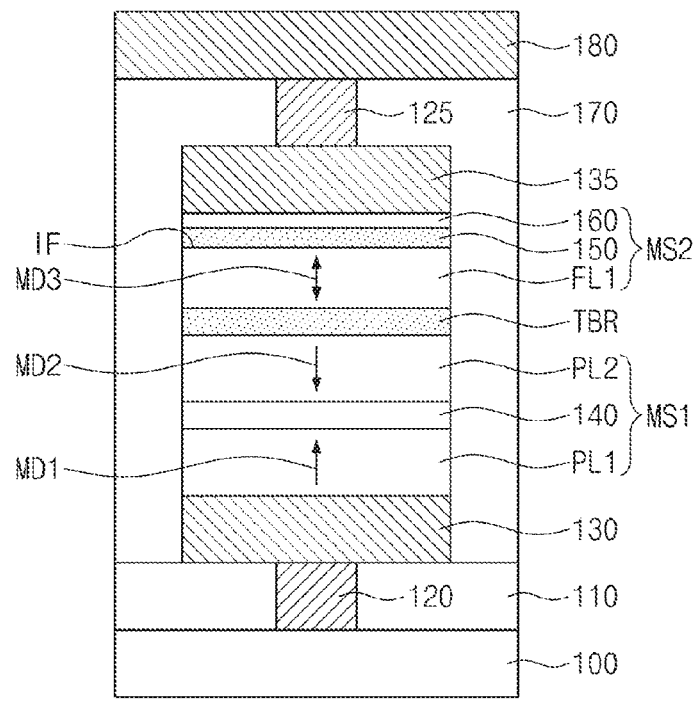
FIG. 2 is a cross-sectional view showing a magnetic memory device according to some example embodiments of the present inventive concepts.

FIG. 2 is a cross-sectional view showing a magnetic memory device according to some example embodiments of the present inventive concepts.

Referring to FIG. 2, a first dielectric layer 110 may be disposed on a substrate 100, and a lower contact plug 120 may be provided to penetrate the first dielectric layer 110. The lower contact plug 120 may have a bottom surface electrically coupled to one terminal of a select element. The substrate 100 may be one of a material having semiconductor characteristics, an insulative material, and a semiconductor or conductor covered with an insulative material. For example, the substrate 100 may be a silicon substrate.

The first dielectric layer 110 may include oxide, nitride, and/or oxynitride. The lower contact plug 120 may include a conductive material. For example, the conductive material may include at least one of dopant-doped semiconductor (e.g., doped silicon, doped germanium, doped silicon-germanium, etc.), metal (e.g., titanium, tantalum, tungsten, etc.), and conductive metal nitride (e.g., titanium nitride, tantalum nitride, etc.).

The first dielectric layer 110 may be provided thereon with a first conductive structure 130, a first magnetic structure MS1, a tunnel barrier pattern TBR, a second magnetic structure MS2, and a second conductive structure 135 that are sequentially stacked. The first conductive structure 130 may be electrically coupled to a top surface of the lower contact plug 120. The first magnetic structure MS1, the tunnel barrier pattern TBR, and the second magnetic structure MS2 may constitute a magnetic tunnel junction.

For example, the first conductive structure 130, the first magnetic structure MS1, the tunnel barrier pattern TBR, the second magnetic structure MS2, and the second conductive structure 135 may include sidewalls aligned with each other. In some example embodiments, as not shown in figures, the first conductive structure 130, the first magnetic structure MS1, the tunnel barrier pattern TBR, the second magnetic structure MS2, and the second conductive structure 135 may include sidewalls having a sloped profile.

The first magnetic structure MS1 may include a first pinned magnetic pattern PL1 on the first conductive structure 130, a second pinned magnetic pattern PL2 on the first pinned magnetic pattern PL1, and an exchange coupling pattern 140 between the first and second pinned magnetic patterns PL1 and PL2. In detail, the first pinned magnetic pattern PL1 may be interposed between the first conductive structure 130 and the exchange coupling pattern 140, and the second pinned magnetic pattern PL2 may be interposed between the exchange coupling pattern 140 and the tunnel barrier pattern TBR.

The second magnetic structure MS2 may include a first free magnetic pattern FL1 on the tunnel barrier pattern TBR, a capping pattern 150 on the first free magnetic pattern FL1, and an oxidation pattern 160 on the capping pattern 150. The first free magnetic pattern FL1 may be interposed between the tunnel barrier pattern TBR and the capping pattern 150.

Each of the first and second pinned magnetic patterns PL1 and PL2 may have a fixed magnetization direction (e.g., a magnetization direction that is fixed in one direction, a unidirectionally fixed magnetization direction, etc.). In detail, each of the first and second pinned magnetic patterns PL1 and PL2 may have a magnetization direction MD1 and MD2, respectively, that is perpendicular or substantially perpendicular (e.g., perpendicular within manufacturing tolerances and/or material tolerances) to one surface (or a top surface), which is close to the tunnel barrier pattern TBR, of the second pinned magnetic pattern PL2. The exchange coupling pattern 140 may cause the second pinned magnetic pattern PL2 to have a magnetization direction MD2 fixed anti-parallel to the magnetization direction MD1 of the first pinned magnetic pattern PL1.

The first free magnetic pattern FL1 may have an adjustable magnetization direction MD3. In detail, the first free magnetic pattern FL1 may have a magnetization direction MD3 that is perpendicular or substantially perpendicular to its one surface (or its bottom surface) close to (e.g., proximate to) the tunnel barrier pattern TBR.

A program operation may cause the first free magnetic pattern FL1 to have a magnetization direction MD3 changed parallel or anti-parallel to the fixed magnetization direction MD2 of the second pinned magnetic pattern PL2. The magnetization direction MD3 of the first free magnetic pattern FL1 may be changed by an STT (spin torque transfer) program operation. That is, the magnetization direction MD3 of the first free magnetic pattern FL1 may be changed using spin torques of electrons in a program current.

The first conductive structure 130 may include at least one of metal and conductive metal nitride. In some example embodiments, the first conductive structure 130 may be a seed of the first pinned magnetic pattern PL1. For example, when the first pinned magnetic pattern PL1 is formed of a perpendicular magnetic material of an $L1_0$ structure, the first conductive structure 130 may include conductive metal nitride having a sodium chloride (NaCl) crystal structure (e.g., titanium nitride, tantalum nitride, chromium nitride, or vanadium nitride). In some example embodiments, when the first pinned magnetic pattern PL1 has a hexagonal close-packed crystal structure, the first conductive structure 130 may include a conductive material (e.g., Ru) having the hexagonal close-packed crystal structure. In some example embodiments, the first conductive structure 130 may include a conductive material (e.g., Ti or Ta) different from the above.

The second conductive structure 135 may be configured to protect the oxidation pattern 160. For example, the second conductive structure 135 may include metal such as Ru or Ta. The second conductive structure 135 may further include conductive metal nitride. In some example embodiments, the second conductive structure 135 may include only conductive metal nitride.

The first magnetic structure MS1 may include a synthetic anti-ferromagnetic (SAF) structure. In detail, the first pinned magnetic pattern PL1 may include a perpendicular magnetic material. For example, the first pinned magnetic pattern PL1 may include a) cobalt-iron-terbium (CoFeTb) having a terbium (Tb) content ratio of more than about 10%, b) cobalt-iron-gadolinium (CoFeGd) having a gadolinium (Gd) content ratio of more than about 10%, c) cobalt-iron-dysprosium (CoFeDy), d) FePt of an $L1_0$ structure, e) FePd of an $L1_0$ structure, f) CoPd of an $L1_0$ structure, g) CoPt of an $L1_0$ structure, h) CoPt of a hexagonal close-packed lattice structure, i) an alloy including at least one of materials discussed in a) to h). In some example embodiments, the first pinned magnetic pattern PL1 may be a structure in which magnetic and non-magnetic layers are stacked alternately and repeatedly. The structure, in which magnetic and non-magnetic layers are stacked alternately and repeatedly, may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacked layers).

The exchange coupling pattern 140 may combine the magnetization directions of the first and second pinned magnetic patterns PL1 and PL2 to be anti-parallel to each other. For example, the exchange coupling pattern 140 may combine the magnetization directions of the first and second pinned magnetic patterns PL1 and PL2 to be anti-parallel to each other due to the RKKY (Ruderman-Kittel-Kasuya-Yosida) interaction. In this configuration, the first magnetic structure MS1 may exhibit a minimal net magnetic field caused by mutual compensation between magnetic fields produced from the magnetization directions of the first and second magnetic patterns PL1 and PL2. As a result, a magnetic field produced from the first magnetic structure MS1 may have a minimal effect on the first free magnetic pattern FL1. The exchange coupling pattern 140 may include at least one of ruthenium, iridium, and rhodium.

The second pinned magnetic pattern PL2 may be a single- or multi-layered structure including at least one of perpendicular magnetic materials such as CoFeB, FeB, CoFeBTa, CoHf, Co, and CoZr. In more detail, the second pinned magnetic pattern PL2 may be a single-layered structure including CoFeB. In some example embodiments, the second pinned magnetic pattern PL2 may be a multi-layered structure including FeB and CoFeB layers, Co and CoHf layers, or CoFeBTa and CoFeB layers.

In some example embodiments, the first pinned magnetic pattern PL1 and the exchange coupling pattern 140 may be omitted. For example, the second pinned magnetic pattern PL2 may have a surface in contact with the tunnel barrier pattern TBR and an opposite surface in contact with the first conductive structure 130.

The tunnel barrier pattern TBR, together with the first magnetic structure MS1 and the second magnetic structure MS2, may constitute a magnetic tunnel junction pattern. The tunnel barrier pattern TBR may be formed of a dielectric material. For example, the tunnel barrier pattern TBR may include at least one of magnesium oxide, titanium oxide, aluminum oxide, magnesium-zinc oxide, and magnesium-boron oxide. The tunnel barrier pattern TBR may preferably include magnesium oxide having a sodium chloride crystal structure.

The first free magnetic pattern FL1 may include a magnetic material having at least one selected from the group consisting of Fe, Ni, and Co. In other words, the first free magnetic pattern FL1 may include an alloy consisting of one or more selected from Fe, Ni, and Co. For example, the first free magnetic pattern FL1 may include cobalt-iron (CoFe), cobalt-iron-boron (CoFeB), nickel-iron-boron (NiFeB), or cobalt-iron-nickel-boron (CoFeNiB).

The first free magnetic pattern FL1 may be in a crystalline state. In some example embodiments, at least a portion of the first free magnetic pattern FL1 may include a body centered cubic (BCC) crystal structure. If and/or when the first free magnetic pattern FL1 includes cobalt-iron-boron (CoFeB), the crystalline portion of the first free magnetic pattern FL1 may have a boron concentration of less than about 15%.

At an interface between the tunnel barrier pattern TBR and the first free magnetic pattern FL1, oxygen atoms of the tunnel barrier pattern TBR may combine with atoms (e.g. Fe atoms) of a magnetic material included in the first free magnetic pattern FL1. Thus, an interface perpendicular magnetic anisotropy (i-PMA) may be induced at the interface between the tunnel barrier pattern TBR and the first free magnetic pattern FL1. The interface perpendicular magnetic anisotropy induced at the interface may cause the first free magnetic pattern FL1 to have a magnetization direction that is perpendicular or substantially perpendicular to a bottom surface of the first free magnetic pattern FL1.

Figure 3:
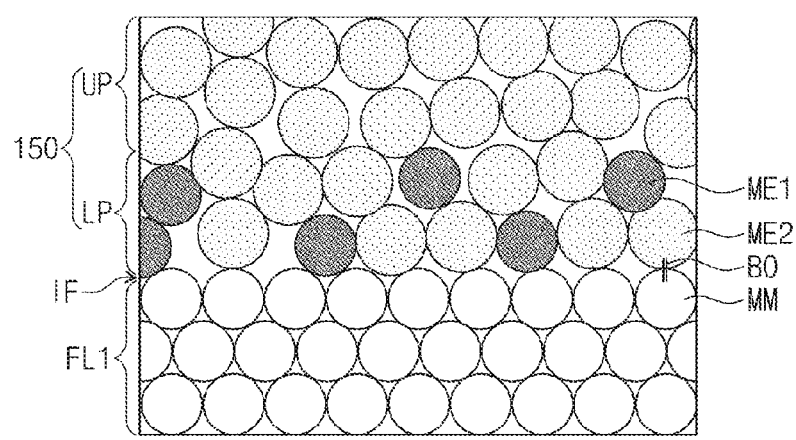
FIG. 3 is an enlarged cross-sectional view showing the vicinity of an interface between a first free magnetic pattern and a capping pattern.

FIG. 3 is an enlarged cross-sectional view showing the vicinity of an interface between the first free magnetic pattern and the capping pattern.

Referring to FIGS. 2 and 3, the capping pattern 150 may include at least one first metal element ME1 and at least one second metal element ME2. The second metal element ME2 may have an atomic weight greater than that of the first metal element ME1. In other words, the second metal element ME2 may be heavier than the first metal element ME1. For example, the first metal element ME1 may be Mg, Ca, Al, Be, Li, or Ti, and the second metal element ME2 may be Ta, W, Hf, Mo, Nb, Zr, Y, Cr, or V. As discussed above, the first free magnetic pattern FL1 may include a magnetic material MM (e.g., a metal element) and FIG. 3 shows Fe as the magnetic material MM.

In some example embodiments, the first and second metal elements ME1 and ME2 of the capping pattern 150 may be present without chemical bonding to other materials. In some example embodiments, ones of the first and second metal elements ME1 and ME2 of the capping pattern 150 may combine with some material such as oxygen (O) or boron (B), thereby forming metal oxide or metal boride. The metal oxide or metal boride may be formed by boron (B) diffused from the first free magnetic pattern FL1 or by oxygen (O) diffused from the oxidation pattern 160.

At an interface IF between the first free magnetic pattern FL1 and the capping pattern 150, an interface perpendicular magnetic anisotropy may be induced by a combination BO of an atom of the second metal element ME2 with an atom (e.g., an iron (Fe) atom) of the magnetic material MM. A magnetization direction by the interface perpendicular magnetic anisotropy at the interface IF may be parallel to a magnetization direction by the interface perpendicular magnetic anisotropy at the interface between the tunnel barrier pattern TBR and the first free magnetic pattern FL1 discussed above.

The first metal element ME1 may have a concentration that is larger on a first portion LP, which is close to the interface IF, of the capping pattern 150 than on a second portion UP, which is far away from the interface IF, of the capping pattern 150. In other words, the first metal element ME1 may be distributed concentrating on the first portion LP adjacent to the interface IF. The capping pattern 150 may have a thickness in the range from about 5 Å to about 15 Å, but not limited thereto.

According to some example embodiments of the present inventive concepts, a substrate was provided thereon with a seed layer including NiCr/Ta/CoFeB layers that are sequentially stacked. The seed layer was provided thereon with a MgO layer as a tunnel barrier layer. The tunnel barrier layer was provided thereon with a free magnetic layer including sequentially stacked CoFeB/Fe layers. The free magnetic layer was provided thereon with a capping layer formed by depositing Mg 3.5 Å thick (as a first metal element) and then depositing Ta 3.5 Å thick (as a second metal element). By doing so, a magnetic structure was prepared according to the present inventive concepts.

In some example embodiments, the capping layer was completely oxidized by supplying oxygen for 120 seconds so that a magnetic structure was prepared. In some example embodiments, another magnetic structure was prepared by additionally forming a MgO layer as an oxidation layer (also referred to herein as a metal oxidation layer) on the oxidized capping layer of some example embodiments. The magnetic structures were measured to obtain corresponding M-H (magnetization-magnetic field) Loops, which are respectively plotted in FIGS. 13A to 13C.

Figure 13A:
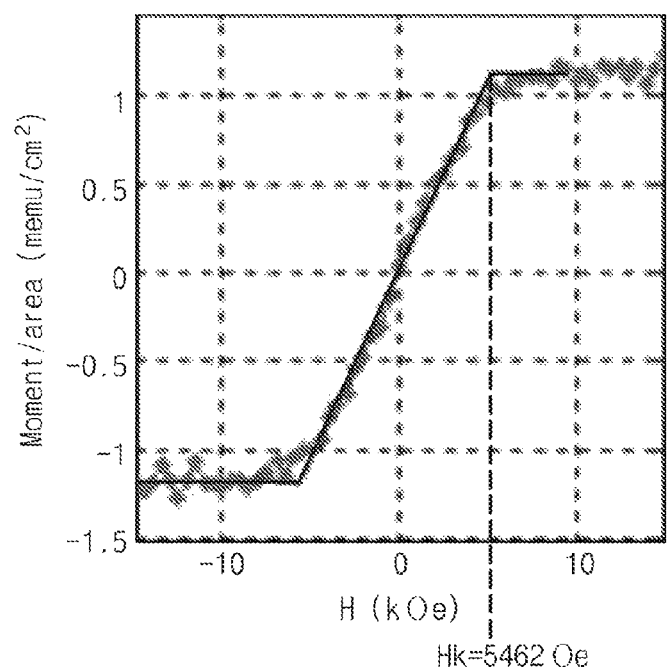
FIG. 13A, FIG. 13B, and FIG. 13C are graphs showing an M-H loop of magnetic structures according to experimental examples of the present inventive concepts.
Figure 13B:
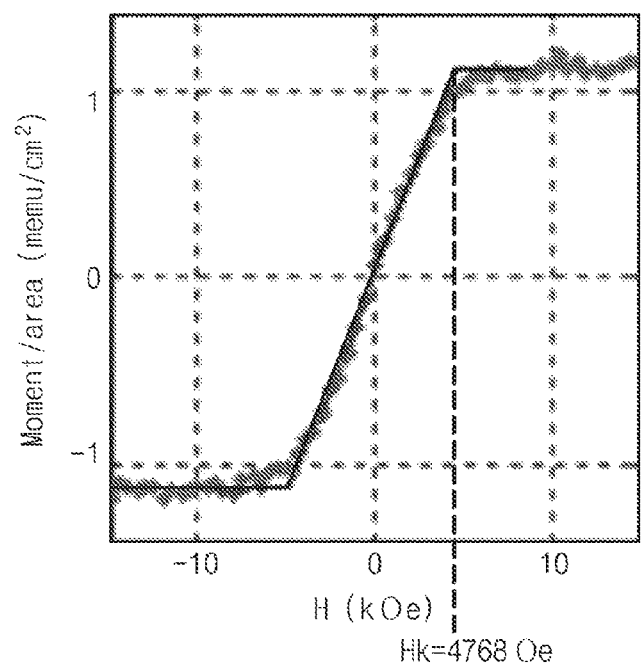
Figure 13C:
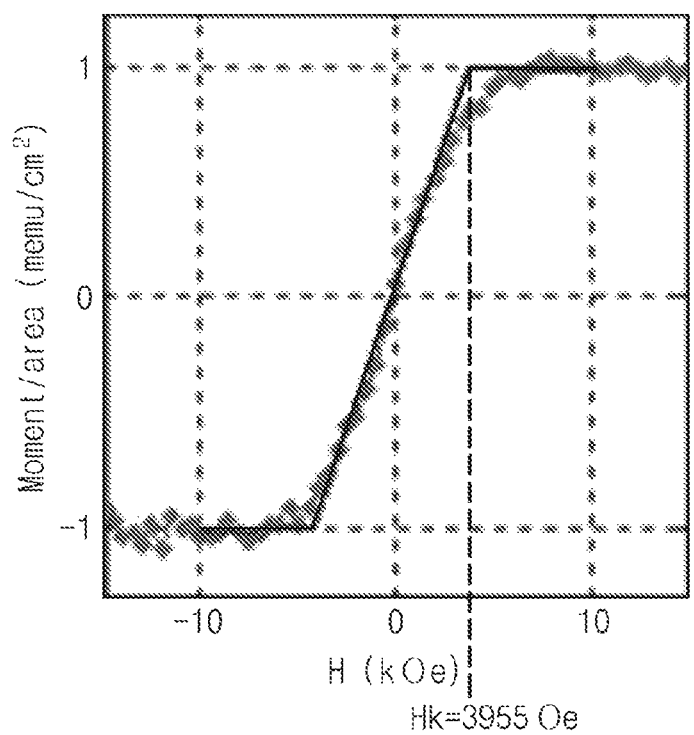

The M-H loop of the magnetic structure prepared by depositing Mg 3.5 Å thick (as a first metal element) and then depositing Ta 3.5 Å thick (as a second metal element) is plotted in FIG. 13A, the M-H loop of the magnetic structure prepared by completely oxidizing the capping layer is plotted in FIG. 13B, and the M-H loop of the magnetic structure prepared by forming a MgO layer as an oxidation layer on the oxidized capping layer is plotted in FIG. 13C. In each graph, saturation of magnetic moment means that a magnetization direction of a free magnetic layer is changed from a perpendicular direction to a horizontal direction. Thus, a value of hard axis anisotropy field Hk may fall on an X-axis value at the time the magnetic moment begins to saturate. These graphs may demonstrate that the greatest measured value of hard axis anisotropy Hk is found in the magnetic structure prepared by depositing Mg 3.5 Å thick (as a first metal element) and then depositing Ta 3.5 Å thick (as a second metal element) according to the present inventive concepts. In other words, it may be ascertained that an interface perpendicular magnetic anisotropy (i-PMA) of the magnetic structure prepared by depositing Mg 3.5 Å thick (as a first metal element) and then depositing Ta 3.5 Å thick (as a second metal element) is superior to those of the magnetic structure prepared by completely oxidizing the capping layer and the magnetic structure prepared by forming a MgO layer as an oxidation layer on the oxidized capping layer.

Referring back to FIGS. 2 and 3, the oxidation patterns 160 may include metal oxide. The oxidation pattern 160 may prevent a spin pumping phenomenon in which a spin electron comes out from the capping pattern 150 consisting of the first and second metal elements ME1 and ME2. For example, the oxidation pattern 160 may include at least one of tantalum oxide, magnesium oxide, titanium oxide, zirconium oxide, hafnium oxide, and zinc oxide. The oxidation pattern 160 may have resistance equal to or less than one third of that of the tunnel barrier pattern TBR. In some example embodiments, the oxidation pattern 160 may be omitted.

The substrate 100 may be provided on its entire surface with a second dielectric layer 170 that covers the first conductive structure 130, the first magnetic structure MS1, the tunnel barrier pattern TBR, the second magnetic structure MS2, and the second conductive structure 135. An upper contact plug 125 may be formed to penetrate the second dielectric layer 170 so that the second conductive structure 135 may be coupled to the upper contact plug 125. The second dielectric layer 170 may include oxide, nitride, and/or oxynitride, and the upper contact plug 125 may include at least one of metal (e.g., titanium, tantalum, copper, aluminum, or tungsten) and conductive metal nitride (e.g., titanium nitride or tantalum nitride).

An interconnect line 180 may be formed on the second dielectric layer 170. The interconnect line 180 may be coupled to the upper contact plug 125. The interconnect line 180 may include at least one of metal and conductive metal nitride. In some example embodiments, the interconnect line 180 may be a bit line.

FIG. 4A, FIG. 5A, FIG. 6, FIG. 7 and FIG. 8 are cross-sectional views showing a method for manufacturing a magnetic memory device according to some example embodiments of the present inventive concepts. FIG. 4B and FIG. 5B are enlarged cross-sectional views showing the vicinity of an interface between a first free magnetic layer and a metal layer.

Figure 4A:
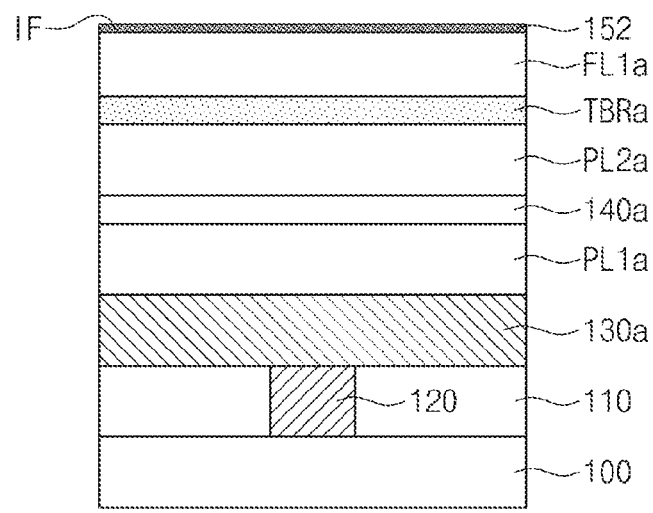
FIG. 4A, FIG. 5A, FIG. 6, FIG. 7 and FIG. 8 are cross-sectional views showing a method for manufacturing a magnetic memory device according to some example embodiments of the present inventive concepts.
Figure 4B:
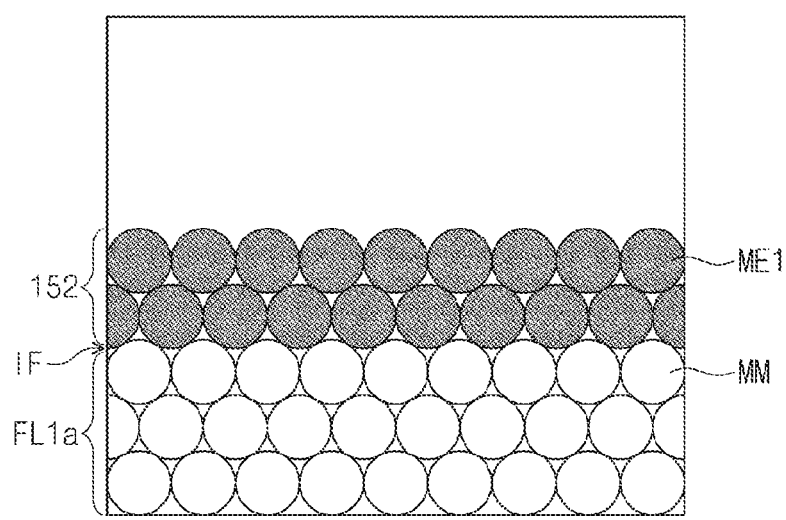
FIG. 4B and FIG. 5B are enlarged cross-sectional views showing the vicinity of an interface between a first free magnetic layer and a metal layer.

Referring to FIGS. 4A and 4B, a first dielectric layer 110 may be formed on a substrate 100. A lower contact plug 120 may be formed to penetrate the first dielectric layer 110. A first preliminary conductive structure 130a may be formed on the first dielectric layer 110. The first preliminary conductive structure 130a may be formed by at least one of a physical vapor deposition (PVD) process, a chemical vapor deposition (CVD) process, and an atomic layer deposition (ALD) process. In some example embodiments, the first preliminary conductive structure 130a may be formed by a sputtering process, which is a kind of PVD process. The first preliminary conductive structure 130a may be formed of the same material as the first conductive structure 130 discussed above with reference to FIG. 2. The first preliminary conductive structure 130a may be electrically coupled to the lower contact plug 120.

The first preliminary conductive structure 130a may be provided thereon with a first pinned magnetic layer PL1a, an exchange coupling layer 140a, and a second pinned magnetic layer PL2a that are sequentially formed. Each of the first pinned magnetic layer PL1a, the exchange coupling layer 140a, and the second pinned magnetic layer PL2a may be formed by a PVD process, a CVD process, and an ALD process. The first pinned magnetic layer PL1a may be formed of the same magnetic material as the first pinned magnetic pattern PL1 discussed above with reference to FIG. 2. The exchange coupling layer 140a may be formed of the same material as the exchange coupling pattern 140 discussed above with reference to FIG. 2. The second pinned magnetic layer PL2a may be formed of the same magnetic material as the second pinned magnetic pattern PL2 discussed above with reference to FIG. 2.

A tunnel barrier layer TBRa may be formed on the second pinned magnetic layer PL2a. For example, the tunnel barrier layer TBRa may be formed by a sputtering process using a tunnel barrier material as a target. The target may include a tunnel barrier material having precisely controlled stoichiometry. In detail, the tunnel barrier material may be the same material as the tunnel barrier pattern TBR discussed above with reference to FIG. 2.

A first free magnetic layer FL1a may be formed on the tunnel barrier layer TBRa. The first free magnetic layer FL1a may be formed by one of PVD, CVD and ALD processes. The first free magnetic layer FL1a may be formed of the same magnetic material as the first free magnetic pattern FL1 discussed above with reference to FIG. 2.

A first metal layer 152 may be formed on the first free magnetic layer FL1a. The first metal layer 152 may be formed by an ALD process or a sputtering process that is a type of PVD process. The first metal layer 152 may be formed of (e.g., may at least partially comprise) one or more first metal elements ME1. The first metal element ME1 may be the same as the first metal element ME1 of the capping pattern 150 discussed above with reference to FIGS. 2 and 3. For example, the first metal layer 152 may be deposited to have a thickness ranging from about 2 Å to about 5 Å, but not limited thereto.

In some example embodiments, since the first metal element ME1 has a relatively small atomic weight, atoms of the first metal elements ME1 may not enter into the first free magnetic layer FL1a. In other words, atoms of the first metal elements ME1 may simply accumulate on the magnetic material MM. Smoothness may thus be preserved on an interface IF between the first free magnetic layer FL1a and the first metal layer 152. The first metal layer 152 may be configured to protect the interface IF (e.g., serve as a "bumper") when a second metal element ME2 is deposited thereon) which is discussed below.

Figure 5A:
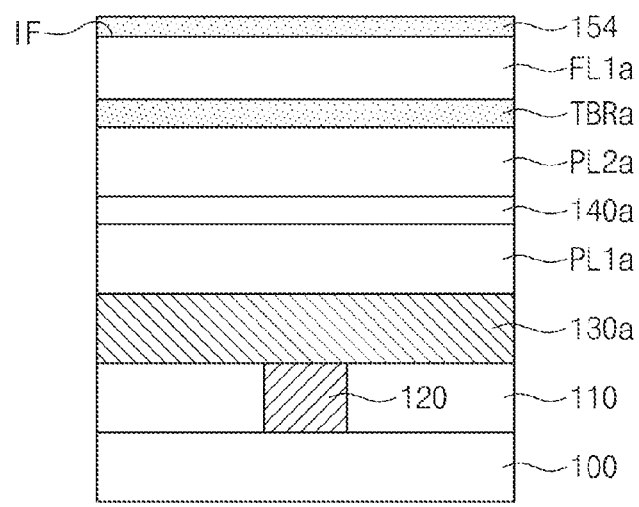
Figure 5B:
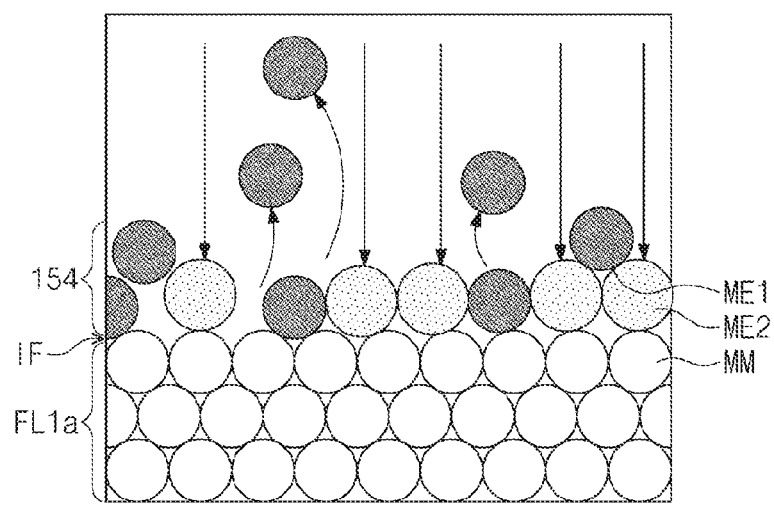

Referring to FIGS. 5A and 5B, a second metal layer 154 may be formed by depositing one or more second metal elements ME2 on the first metal layer 152. The second metal layer 154 may be formed from the first metal layer 152. The second metal element ME2 may be deposited by a sputtering process that is a kind of PVD process. The second metal element ME2 may be the same as the second metal element ME2 of the capping pattern 150 discussed above with reference to FIGS. 2 and 3. For example, the second metal layer 154 may be deposited to have a thickness ranging from about 2 Å to about 15 Å, but not limited thereto.

In some example embodiments, the second metal element ME2 may have a relatively large atomic weight. Thus, when the second metal elements ME2 are deposited, atoms of the second metal elements ME2 may collide with atoms of the first metal elements ME1. Thus, ones of the atoms in the first metal elements ME1 may be released to outside because atomic weight of the first metal element ME1 is relatively small. In contrast, atoms of the second metal elements ME2 may simply accumulate on the magnetic material MM.

Atoms of the second metal elements ME2 may thus not enter into the first free magnetic layer FL1a and the interface IF may be kept smooth. In other words, the first metal element ME1 may protect the magnetic material MM.

In conclusion, the second metal layer 154 may have an inner structure similar to that of the capping pattern 150 discussed above with reference to FIG. 3. For example, the second metal layer 154 may include therein the mixture of the first and second metal elements ME1 and ME2. Within the second metal layer 154, the first metal element ME1 may have a concentration that decreases with increasing distance from the interface IF. Restated, the first metal element ME1 may be included in the second metal layer 154 in a concentration that varies with a distance through the thickness of the capping pattern 150 from the interface IF. The concentration of the first metal element ME1 in the capping pattern may be proportional with proximity to the interface IF between the second metal layer 154 of the capping pattern 150 and the first free magnetic layer FL1a, for example as shown in the example embodiments illustrated in FIG. 3. Thus, the concentration of the first metal element ME1 in a given portion of the capping pattern 150 may increase with increasing proximity of the given portion of the capping pattern 150 to the interface IF in a direction that is substantially perpendicular to the interface IF (e.g., a thickness direction of the capping pattern 150). The second metal element ME2 may combine with the magnetic material MM (e.g., Fe) at the interface IF to induce an interface perpendicular magnetic anisotropy.

In some example embodiments, the second metal layer 154 may undergo thereon a plasma treatment using hydrogen and/or inert gas. The plasma treatment may however be omitted.

Figure 9A:
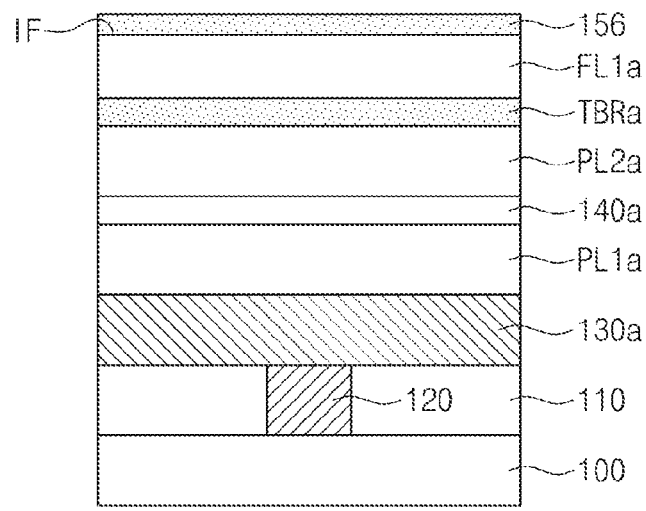
FIG. 9A is a cross-sectional view showing a method for manufacturing a magnetic memory device according to a comparative example of the present inventive concepts.
Figure 9B:
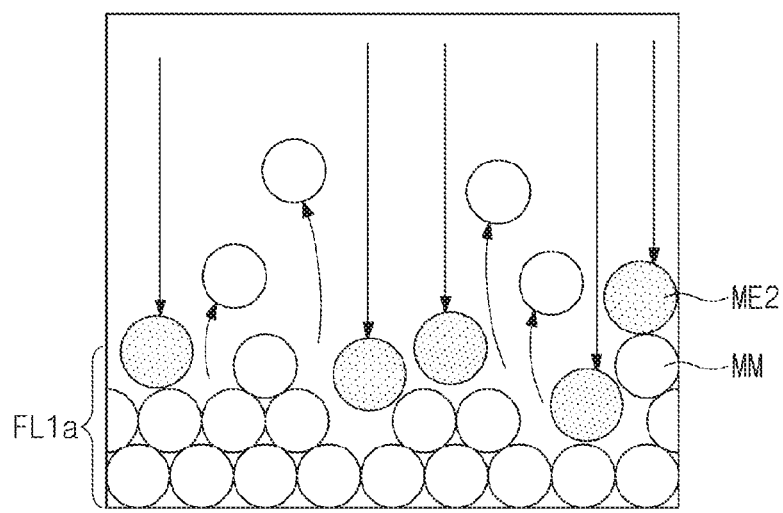
FIG. 9B is an enlarged cross-sectional view showing the vicinity of an interface between a first free magnetic layer and a metal layer illustrated in a comparative example.

FIG. 9A is a cross-sectional view showing a method for manufacturing a magnetic memory device according to a comparative example of the present inventive concepts. FIG. 9B is an enlarged cross-sectional view showing the vicinity of an interface between a first free magnetic layer and a metal layer illustrated in a comparative example.

Referring to FIGS. 9A and 9B, a third metal layer 156 may be formed by depositing one or more second metal elements ME2 directly on the first free magnetic layer FL1a. Differently from those discussed above with reference to FIGS. 4A, 4B, 5A and 5B, the formation of the first metal layer 152 may be omitted. If and/or when the second metal elements ME2 are deposited, atoms of the second metal elements ME2 may collide with atoms of the magnetic material MM. Since the second metal element ME2 has a relatively large atomic weight, ones of atoms of the magnetic material MM may be released to outside. Also, ones of atoms of the second elements ME2 may enter into the first free magnetic layer FL1a. An interface IF between the first free magnetic layer FL1a and the third metal layer 156 may become irregular. This may finally deteriorate an interface perpendicular magnetic anisotropy at the interface IF.

According to some example embodiments of the present inventive concepts, the first metal layer 152 may be formed on the first free magnetic layer FL1a before depositing the second metal element ME2 that protects the first free magnetic layer FL1a, thereby enhancing an interface perpendicular magnetic anisotropy.

Figure 6:
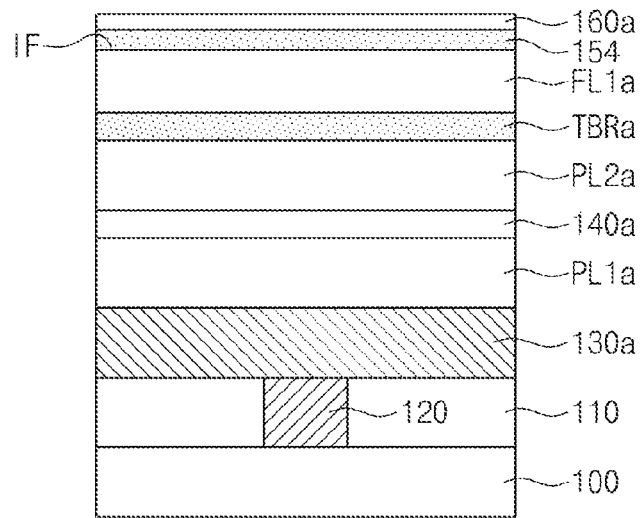

Referring to FIG. 6, an oxidation layer 160a, also referred to herein as a metal oxidation layer, may be formed on the second metal layer 154. The oxidation layer 160a may be formed of the same metal oxide as the oxidation pattern 160 discussed above with reference to FIG. 2. The oxidation layer 160a may include at least one of tantalum oxide, magnesium oxide, titanium oxide, zirconium oxide, hafnium oxide, and zinc oxide. In some example embodiments, the oxidation layer 160a may be formed by a sputtering process using metal oxide as a target. In some example embodiments, the oxidation layer 160a may be formed by depositing metal using one of PVD, CVD and ALD processes and then oxidizing the metal. Differently, the oxidation layer 160a may be formed by selectively oxidizing an upper portion of the second metal layer 154. In this case, the oxidation layer 160a may include oxide of the second metal element ME2. The second metal layer 154 may prevent oxygen atoms from being diffused from the oxidation layer 160a into the interface IF between the first free magnetic layer FL1a and the second metal layer 154.

Figure 7:
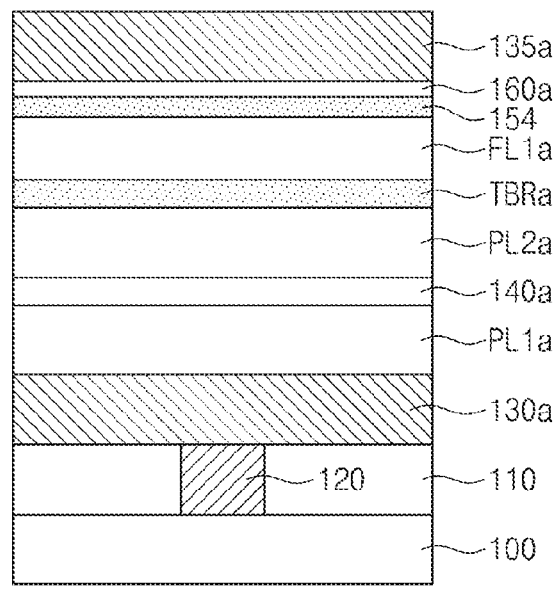

Referring to FIG. 7, a second preliminary conductive structure 135a may be formed on the oxidation layer 160a. The second preliminary conductive structure 135a may be formed by one of PVD, CVD and ALD processes. The second preliminary conductive structure 135a may be formed of the same material as the second conductive structure 135 discussed above with reference to FIG. 2.

A heat treatment process may be performed after the second preliminary conductive structure 135a is formed. Performing a heat treatment process may include heating at least a portion of the structure illustrated in at least FIG. 7. In some example embodiments, performing the heat treatment process may include applying heat to the second preliminary conductive structure 135a. In some example embodiments, performing the heat treatment process may include heating at least the second metal layer 154. Through the heat treatment process (e.g., based on applying heat to the structure), at least a portion of the first free magnetic layer FL1a may become crystalline. For example, the crystalline portion of the first free magnetic layer FL1a may have a body centered cubic crystal structure. The heat treatment process may be performed at a temperature ranging from about 275° C. to about 450° C. (e.g., the structure may be heated to a temperature ranging from about 275° C. to about 450° C.). The heat treatment process may include a laser annealing process (e.g., applying a laser to the structure illustrated in FIG. 7 to cause annealing of at least a portion of the structure), a rapid thermal annealing process (e.g., rapidly applying heat to the structure illustrated in FIG. 7 to cause rapid annealing of at least a portion of the structure), or a thermal annealing process using a furnace (e.g., providing the structure illustrated in FIG. 7 to a furnace to cause annealing of at least a portion of the structure). However, in some example embodiments, the heat treatment process may be omitted.

Figure 8:
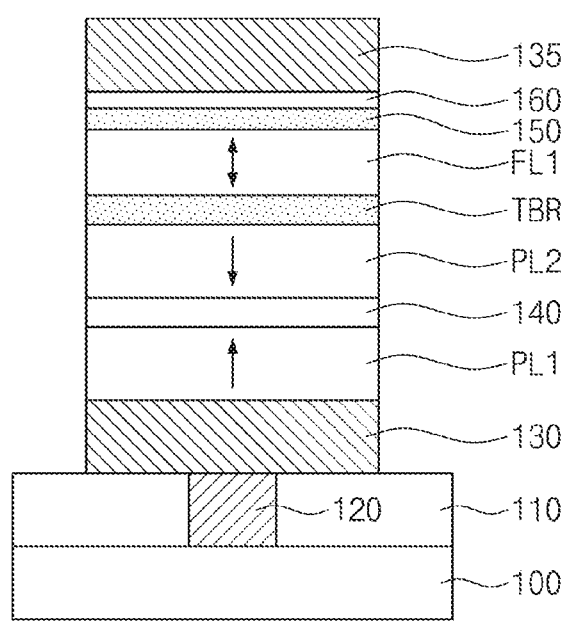

Referring to FIG. 8, the second preliminary conductive structure 135a, the oxidation layer 160a, the second metal layer 154, the first free magnetic layer FL1a, the tunnel barrier layer TBRa, the second pinned magnetic layer PL2a, the exchange coupling layer 140a, the first pinned magnetic layer PL1a, and the first preliminary conductive structure 130a may be successively patterned to form a first conductive structure 130, a first pinned magnetic pattern PL1, an exchange coupling pattern 140, a second pinned magnetic pattern PL2, a tunnel barrier pattern TBR, a first free magnetic pattern FL1, a capping pattern 150, an oxidation pattern 160, and a second conductive structure 135 that are sequentially stacked (e.g., a stack of pattern).

Referring back to FIG. 2, a second dielectric layer 170 may be formed on the first dielectric layer 110. An upper contact plug 125 may be formed to penetrate the second dielectric layer 170 such that the second conductive structure 135 may be coupled to the upper contact plug 125. An interconnect line 180 may be formed on the second dielectric layer 170. The interconnect line 180 may be coupled to the upper contact plug 125.

Figure 10:
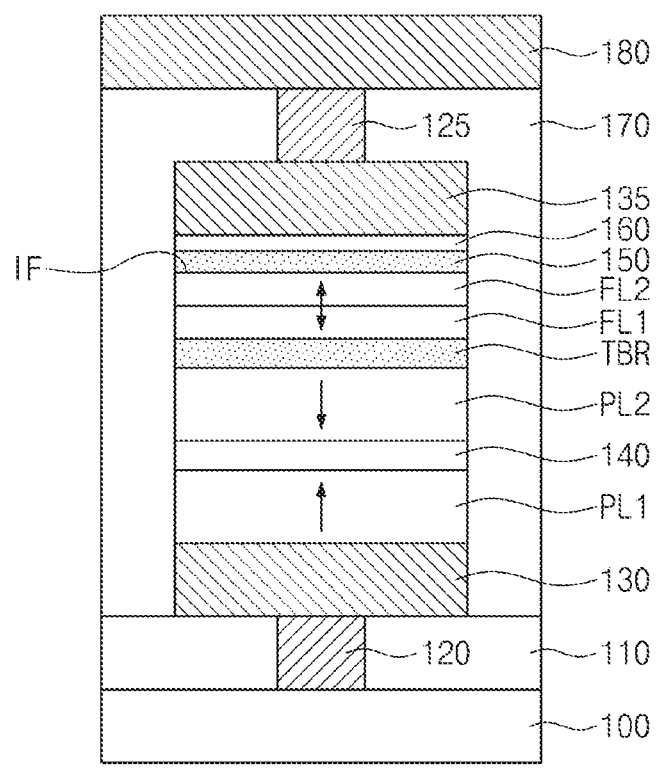
FIG. 10 is a cross-sectional view showing a magnetic memory device according to some example embodiments of the present inventive concepts.

FIG. 10 is a cross-sectional view showing a magnetic memory device according to some example embodiments of the present inventive concepts. In descriptions of some example embodiments, including example embodiments illustrated in one or more of at least FIGS. 10-12, a detailed description of technical features repetitive to those formerly discussed with reference to FIGS. 2 to 3 will be omitted and difference will be discussed in detail.

Referring to FIG. 10, a second free magnetic pattern FL2 may be additionally disposed on the first free magnetic pattern FL1. The first free magnetic pattern FL1 may be interposed between the tunnel barrier pattern TBR and the second free magnetic pattern FL2, and the second free magnetic pattern FL2 may be interposed between the first free magnetic pattern FL1 and the capping pattern 150. In detail, the first free magnetic pattern FL1 may include a first surface and a second surface opposite the first surface. The first surface may be in contact with the tunnel barrier pattern TBR. The second surface may be in contact with the second free magnetic pattern FL2.

The first and second free magnetic patterns FL1 and FL2 may be magnetically connected to each other. A single magnetization direction may thus be made between the first and second free magnetic patterns FL1 and FL2 that are magnetically connected to each other. For example, the first and second free magnetic patterns FL1 and FL2 may be in direct contact with each other. In some example embodiments, the first and second free magnetic patterns FL1 and FL2 may be magnetically connected to each other with a material layer (not shown) interposed therebetween.

Each of the first and second free magnetic patterns FL1 and FL2 may independently include a magnetic material having at least one selected from the group consisting of Fe, Ni, and Co. For example, the first free magnetic pattern FL1 may include cobalt-iron (CoFe) or cobalt-iron-boron (CoFeB). The second free magnetic pattern FL2 may include iron (Fe), cobalt-iron-boron (CoFeB), nickel-iron-boron (NiFeB), or cobalt-iron-nickel-boron (CoFeNiB).

The second free magnetic pattern FL2 may have an Fe concentration greater than that of the first free magnetic pattern FL1. It thus may be possible to enhance an interface perpendicular magnetic anisotropy induced by a combination of the second metal element and a magnetic material (e.g., Fe) at an interface IF between the second free magnetic pattern FL2 and the capping pattern 150.

Likewise the first free magnetic pattern FL1, at least a portion of the second free magnetic pattern FL2 may be crystalline. The crystalline portion of the second free magnetic pattern FL2 may include a body centered cubic (BCC) crystal structure, or a mixture of a body centered cubic (BCC) crystal structure and a face centered cubic (FCC) crystal structure.

Figure 11:
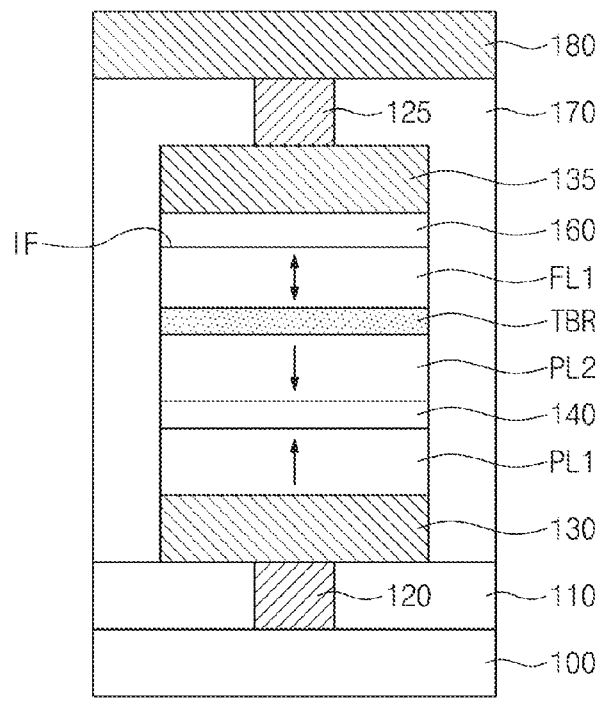
FIG. 11 is a cross-sectional view showing a magnetic memory device according to some example embodiments of the present inventive concepts.

FIG. 11 is a cross-sectional view showing a magnetic memory device according to some example embodiments of the present inventive concepts. In the description that follows, a detailed description of technical features repetitive to those formerly discussed with reference to FIGS. 2 to 3 will be omitted and difference will be discussed in detail.

Referring to FIG. 11, the capping pattern 150 may be omitted. The oxidation pattern 160 may be in direct contact with the first free magnetic pattern FL1. An interface perpendicular magnetic anisotropy may be induced, at an interface IF between the oxidation pattern 160 and the first free magnetic pattern FL1, by combining the magnetic material of the first free magnetic pattern FL1 with oxygen of metal oxide of the oxidation pattern 160. The metal oxide of the oxidation pattern 160 may include metal oxides formed from the first and second metal elements of the capping pattern 150 as well as the metal oxide of the oxidation pattern 160 discussed above with reference to FIG. 2.

Figure 12:
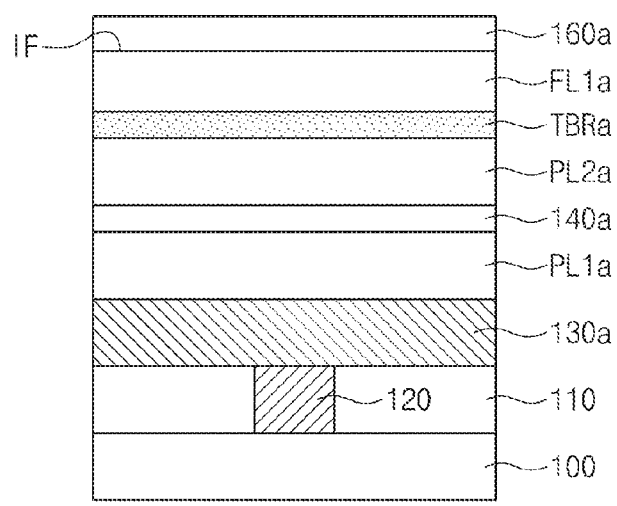
FIG. 12 is a cross-sectional view showing a method for manufacturing a magnetic memory device according to some example embodiments of the present inventive concepts.

FIG. 12 is a cross-sectional view showing a method for manufacturing a magnetic memory device according to some example embodiments of the present inventive concepts. In the description that follows, a detailed description of technical features repetitive to those formerly discussed with reference to FIGS. 4A to 8 will be omitted and difference will be discussed in detail.

Referring to FIG. 12, the oxidation layer 160a may be formed from the second metal layer 154 based on performing an oxidation process on a resultant structure illustrated in FIG. 5A. Performing an oxidation process on the resultant structure may include performing an oxidation process on the second metal layer 154, such that at least a portion of the second metal layer 154 is oxidized to form an oxidation layer 160a, also referred to herein as a metal oxidation layer. The second metal layer 154 may be completely oxidized to form the oxidation layer 160a on the first free magnetic layer FL1a. As the second metal layer 154 is used to form the oxidation layer 160a, the oxidation layer 160a may include metal oxides formed from the first and second metal elements.

The oxidation process may be performed using an oxygen source gas (e.g., an oxygen gas). For example, the oxidation process may be performed at a temperature ranging from about 200° C. to about 300° C. During the oxidation process, an interface perpendicular magnetic anisotropy may be induced, at an interface IF between the oxidation layer 160a and the first free magnetic layer FL1a, by combining the magnetic material of the first free magnetic layer FL1a and oxygen diffused into the interface IF.

A heat treatment process may be performed prior to the oxidation process. The heat treatment process may crystallize at least a portion of the first free magnetic layer FL1a. For example, the crystalline portion of the first free magnetic layer FL1a may have a body centered cubic crystal structure. In addition, the heat treatment process may diffuse boron atoms of the first free magnetic layer FL1a into the second metal layer 154 and thus metal boride may be formed.

The heat treatment process may be performed at a temperature ranging from about 275° C. to about 450° C. The heat treatment process may include a laser annealing process, a rapid thermal annealing process, or a thermal annealing process using a furnace. However, in some example embodiments, the heat treatment process may be omitted.

Successively, the second preliminary conductive structure 135a may be formed on the oxidation layer 160a. Subsequent processes may be the same as those discussed above with reference to FIGS. 2 and 8.

According to some example embodiments of the present inventive concepts, a magnetic memory device may have superior interface perpendicular magnetic anisotropy (i-PMA) induced by a combination of the magnetic material of the free magnetic pattern and the metal material of the capping pattern. Furthermore, the interface between the free magnetic pattern and the capping pattern may be kept smooth, thereby providing uniform interface perpendicular magnetic anisotropy.

Although the present inventive concepts have been described in connection with the embodiments of the present inventive concepts illustrated in the accompanying drawings, it is not limited thereto. It will be apparent to those skilled in the art that various substitution, modifications, and changes may be thereto without departing from the scope and spirit of the inventive concepts.

What is claimed is:

1. A magnetic memory device, comprising:
a pinned magnetic pattern;
a free magnetic pattern;
a tunnel barrier pattern between the pinned magnetic pattern and the free magnetic pattern, wherein the free magnetic pattern includes a first surface in contact with the tunnel barrier pattern and a second surface opposite the first surface; and
a capping pattern on the second surface of the free magnetic pattern, the capping pattern including,
a first portion adjacent to an interface between the free magnetic pattern and the capping pattern,
a second portion spaced apart from the interface, and
a first metal element and a second metal element, the second metal element having an atomic weight greater than an atomic weight of the first metal element, the first portion including a concentration of the first metal element that is greater than a concentration of the first metal element in the second portion.

2. The magnetic memory device of claim 1, wherein,
the free magnetic pattern includes a magnetic material, the magnetic material including at least one selected from a group consisting of Fe, Ni and Co, and
the magnetic memory device includes a mixture of the second metal element and the magnetic material at the interface, such that the magnetic memory device is configured to induce an interface perpendicular magnetic anisotropy (i-PMA).

3. The magnetic memory device of claim 2, wherein,
the free magnetic pattern includes a stack of patterns, the stack of patterns including a first free magnetic pattern and a second free magnetic pattern on the first free magnetic pattern,
the second free magnetic pattern is between the first free magnetic pattern and the capping pattern, and
the second free magnetic pattern has an Fe concentration that is greater than an Fe concentration of the first free magnetic pattern.

4. The magnetic memory device of claim 1, wherein,
the second metal element includes one of Ta, W, Hf, Mo, Nb, Zr, Y, Cr and V, and
the first metal element includes one of Mg, Ca, Al, Be, Li and Ti.

5. The magnetic memory device of claim 1, wherein the capping pattern has a thickness ranging from about 5 Å to about 15 Å.

6. The magnetic memory device of claim 1, further comprising:
an oxidation pattern on the capping pattern, the oxidation pattern including a metal oxide,
wherein the capping pattern is between the free magnetic pattern and the oxidation pattern.

7. The magnetic memory device of claim 1, wherein,
the pinned magnetic pattern includes,
a first pinned magnetic pattern,
a second pinned magnetic pattern, and
an exchange coupling pattern between the first pinned magnetic pattern and the second pinned magnetic pattern, the first pinned magnetic pattern is associated with a magnetization direction that is fixed in one direction, and the second pinned magnetic pattern is associated with a magnetization direction that is fixed in a direction inverse to the one direction.

8. The magnetic memory device of claim 1, wherein,
the pinned magnetic pattern is associated with a unidirectionally fixed magnetization direction,
the free magnetic pattern is associated with an adjustable magnetization direction, and
the magnetization directions of the pinned and free magnetic patterns are each substantially perpendicular to a surface of the free magnetic pattern, respectively, the surface of the free magnetic pattern being in contact with the tunnel barrier pattern.

9. The magnetic memory device of claim 1, wherein the pinned magnetic pattern, the tunnel barrier pattern, the free magnetic pattern, and the capping pattern are sequentially stacked on a substrate.

10. A magnetic memory device, comprising:
a free magnetic pattern; and
a capping pattern on the free magnetic pattern, the capping pattern including a first metal element and a second metal element, the second metal element having an atomic weight greater than an atomic weight of the first metal element, the capping pattern including a concentration of the first metal element that varies along a thickness direction of the capping pattern, such that the concentration of the first metal element is proportional with a proximity to an interface between the capping pattern and the free magnetic pattern.

11. The magnetic memory device of claim 10, wherein,
the free magnetic pattern includes a magnetic material, the magnetic material including at least one selected from a group consisting of Fe, Ni and Co, and
the magnetic memory device includes a mixture of the second metal element and the magnetic material at the interface, such that the magnetic memory device is configured to induce an interface perpendicular magnetic anisotropy (i-PMA).

12. The magnetic memory device of claim 10, wherein,
the free magnetic pattern includes a stack of patterns, the stack of patterns including a first free magnetic pattern and a second free magnetic pattern that is stacked on the first free magnetic pattern,
the second free magnetic pattern is between the first free magnetic pattern and the capping pattern, and
the second free magnetic pattern has an Fe concentration that is greater than an Fe concentration of the first free magnetic pattern.

13. The magnetic memory device of claim 10, wherein,
the first metal element includes one of Mg, Ca, Al, Be, Li and Ti, and
the second metal element includes one of Ta, W, Hf, Mo, Nb, Zr, Y, Cr and V.

14. The magnetic memory device of claim 10, further comprising:
an oxidation pattern on the capping pattern, the oxidation pattern including a metal oxide.

15. The magnetic memory device of claim 10, further comprising:

a pinned magnetic pattern, the free magnetic pattern being between the capping pattern and the pinned magnetic pattern.

16. The magnetic memory device of claim 15, wherein,
the pinned magnetic pattern includes,
a first pinned magnetic pattern,
a second pinned magnetic pattern, and
an exchange coupling pattern between the first pinned magnetic pattern and the second pinned magnetic pattern,
the first pinned magnetic pattern is associated with a magnetization direction that is fixed in one direction, and
the second pinned magnetic pattern is associated with a magnetization direction that is fixed in a direction inverse to the one direction.

17. The magnetic memory device of claim 15, wherein,
the pinned magnetic pattern is associated with a unidirectionally fixed magnetization direction,
the free magnetic pattern is associated with an adjustable magnetization direction, and
the magnetization directions of the pinned and free magnetic patterns are each substantially perpendicular to a surface of the free magnetic pattern, respectively, the surface of the free magnetic pattern being in contact with a tunnel barrier layer.

18. A magnetic memory device, comprising:
a free magnetic pattern; and
a non-oxidized capping pattern on the free magnetic pattern, the capping pattern including,
a first portion proximate to an interface between the free magnetic pattern and the capping pattern, the first portion including a first concentration of a first metal element and a first concentration of a second metal element, and
a second portion distal from the interface, the second portion including a second concentration of the first metal element and a second concentration of the second metal element, the second concentration of the first metal element smaller than the first concentration of the first metal element, the second concentration of the second metal element greater than the first concentration of the second metal element.

19. The magnetic memory device of claim 18, wherein,
the free magnetic pattern includes a magnetic material, the magnetic material including at least one selected from a group consisting of Fe, Ni and Co, and
the magnetic memory device includes a mixture of the second metal element and the magnetic material at the interface, such that the magnetic memory device is configured to induce an interface perpendicular magnetic anisotropy (i-PMA).

20. The magnetic memory device of claim 18, wherein
the free magnetic pattern includes a stack of patterns, the stack of patterns including a first free magnetic pattern and a second free magnetic pattern on the first free magnetic pattern,
the second free magnetic pattern is between the first free magnetic pattern and the capping pattern, and
the second free magnetic pattern has an Fe concentration that is greater than an Fe concentration of the first free magnetic pattern.

* * * * *